US009924612B2

(12) United States Patent
Chan et al.

(10) Patent No.: US 9,924,612 B2
(45) Date of Patent: Mar. 20, 2018

(54) CONTAINER DATA CENTER

(71) Applicant: HON HAI PRECISION INDUSTRY CO., LTD., New Taipei (TW)

(72) Inventors: Hung-Chou Chan, New Taipei (TW); Wen-Tang Peng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/293,629

(22) Filed: Oct. 14, 2016

(65) Prior Publication Data

US 2017/0034955 A1    Feb. 2, 2017

Related U.S. Application Data

(62) Division of application No. 14/586,044, filed on Dec. 30, 2014, now Pat. No. 9,661,779.

(30) Foreign Application Priority Data

Oct. 28, 2014    (CN) .......................... 2014 1 0701645

(51) Int. Cl.
*H05K 7/00*    (2006.01)
*H05K 7/14*    (2006.01)
*H05K 7/20*    (2006.01)
*H05K 7/18*    (2006.01)

(52) U.S. Cl.
CPC .......... *H05K 7/1497* (2013.01); *H05K 7/183* (2013.01); *H05K 7/2039* (2013.01); *H05K 7/20709* (2013.01); *H05K 7/20745* (2013.01)

(58) Field of Classification Search
None
See application file for complete search history.

(56) References Cited

U.S. PATENT DOCUMENTS 4,258,967 A  *  3/1981  Boudreau ............ H05K 7/1421
                                                         312/273
2009/0267466 A1 * 10/2009  Zook .................... E05C 9/043
                                                         312/223.6
2010/0319883 A1 * 12/2010  Facusse ............ H05K 7/20809
                                                         165/104.26

* cited by examiner

Primary Examiner — Dimary Lopez Cruz
Assistant Examiner — Zhengfu Feng
(74) Attorney, Agent, or Firm — ScienBiziP, P.C.

(57) ABSTRACT

A space-efficient container data center with cooling devices extending outside but which can be retracted for ease of container transport includes a cabinet and a function module. The cabinet includes a plurality of plates and a bottom. A first one of the plates defines a plurality of spaced openings. At least one door is rotatably attached to the side beside each opening. A support member is rotatably attached to the plates near a bottom edge of each opening. The door and the support members are rotated to open each opening and the support members are aligned with the bottom to allow the function modules to slide outwards to an extended working position on the bottom and the support members, or inwards for compactness.

11 Claims, 5 Drawing Sheets

CONTAINER DATA CENTER

This application is a divisional application of a commonly-assigned application entitled "CONTAINER DATA CENTER", filed on Dec. 30, 2014 with USPTO application Ser. No. 14/586,044. The disclosure of the above-identified application is incorporated herein by reference.

FIELD

The subject matter herein generally relates to a container data center.

BACKGROUND

A container data center is configured with cooling devices in a cabinet of the container data center for heat dissipation, the devices occupy much space of the cabinet.

BRIEF DESCRIPTION OF THE DRAWINGS

Implementations of the present technology will now be described, by way of example only, with reference to the attached figures.

DETAILED DESCRIPTION

Figure 1:
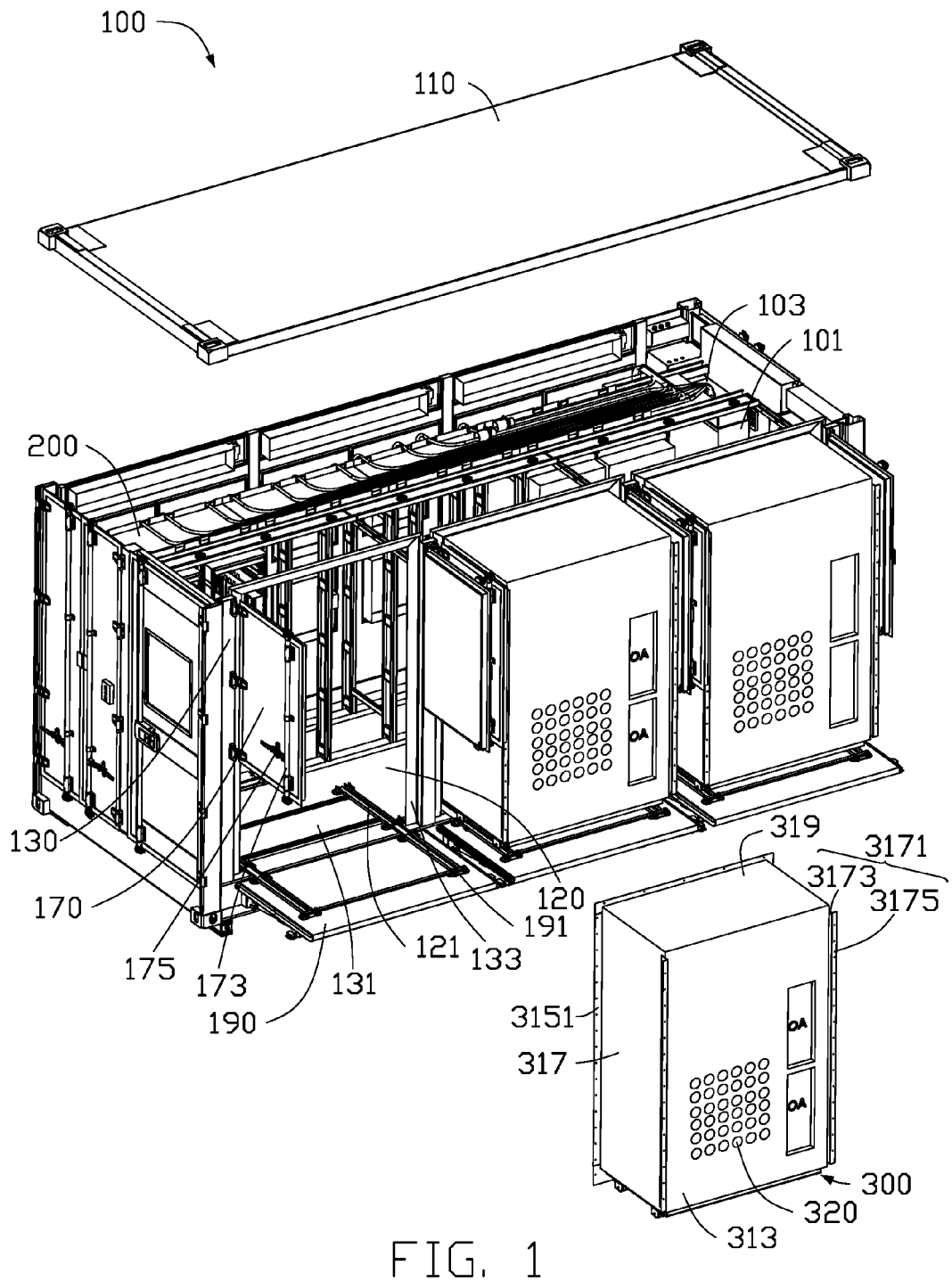
FIG. 1 is an exploded, isometric view of an exemplary embodiment of a container data center, where the container data center comprises a plurality of cooling devices and a plurality of support members.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "inside" indicates that at least a portion of a part is partially contained within a boundary formed by the object. The term "comprising," when utilized, means "including, but not necessarily limited to"; it specifically indicates open-ended inclusion or membership in the so-described combination, group, series and the like.

The present disclosure relates to a container data center.

FIG. 1 illustrates an exemplary embodiment of a container data center. The container data center comprises a cabinet 100, a plurality of electronic devices 200, and a plurality of function modules. In this exemplary embodiment, the function modules are cooling devices 300.

The cabinet 100 as shown in FIG. 1 is cuboid but other shapes may be used. As shown in FIG. 1, the cabinet 100 comprises a top member 110 removably attached to a top portion of the cabinet 100, a bottom member 120, and a plurality of rectangular plates 130 perpendicular to the bottom member 120. The top portion of the cabinet 100 defines a plurality of slots 101. The bottom member 120, the top member 110 and the plurality of plates 130 define an interior space 103. The plates are arranged along a lengthwise direction of the bottom member 120. Each plate 130 defines a rectangular shaped opening 131 that is arranged along a lengthwise direction of the side 130. Two doors 170 are rotatably attached to each opening 131. The two doors 170 has a combined surface area that does not cover the entire opening 131. The two doors 170 only attached to upper portions of two opposite side edges of the first side. A support member 190 is rotatably attached to a bottom edge of the plate 130. A stopper plate 133 extends into the opening 131 from each of the two side edges of each plate 130. Each door 170 comprises a latching member 173 formed on an outside surface of the door 170, and a handle 175 rotatably mounted to the latching member 173.

A pair of first rails 121 are fixed on the bottom member 120 and extend through each opening 131 in a direction perpendicular to the plates 130.

Figure 2:
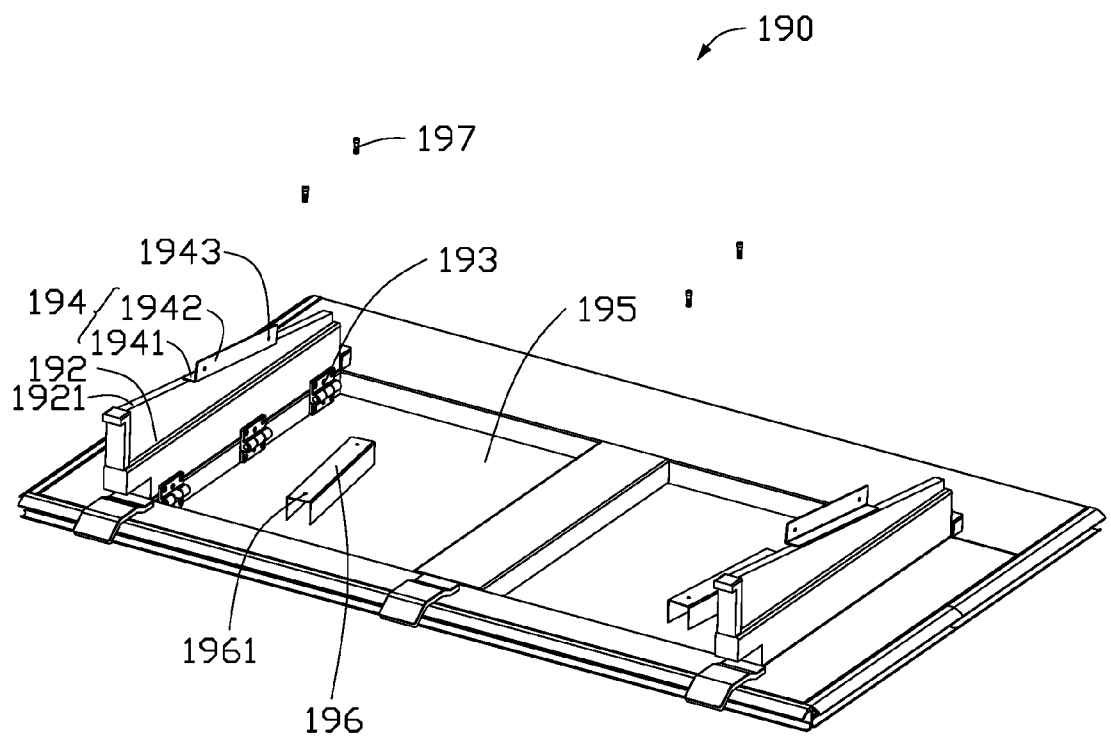
FIG. 2 is an isometric view of one of the support members of FIG. 1 viewed from another angle.

FIG. 2 illustrates one of the support members 190. Each support member 190 is a plate and comprises a pair of second rails 191 formed inside surface of the support member 190, a pair of blocks 192 rotatably attached to an outside surface of the support member 90 by a plurality of hinges 193, and two recessed portions 195 are defined on the support member 190 adjacent to the blocks 192. The two recessed portions 195 are located between the two blocks 192. A slanting wall 1921 is formed on a top edge of each block 192. A first fixing member 194 is attached to the slanting wall 1921. The first fixing member 194 comprises a first tab 1941 attached to the slanting wall 1921, and a second tab 1942 perpendicularly extending from the first tab 1941. The second tab 1942 defines two through holes 1943. A U-shaped second fixing member 196 is formed in each of the recessed portions 195. Each second fixing member 196 defines two screw holes 1961 in a top portion. Each support members 190 comprises a latching member 173 formed on an outside surface of each support member 190, and a handle 175 rotatably mounted to the latching member 173.

Figure 3:
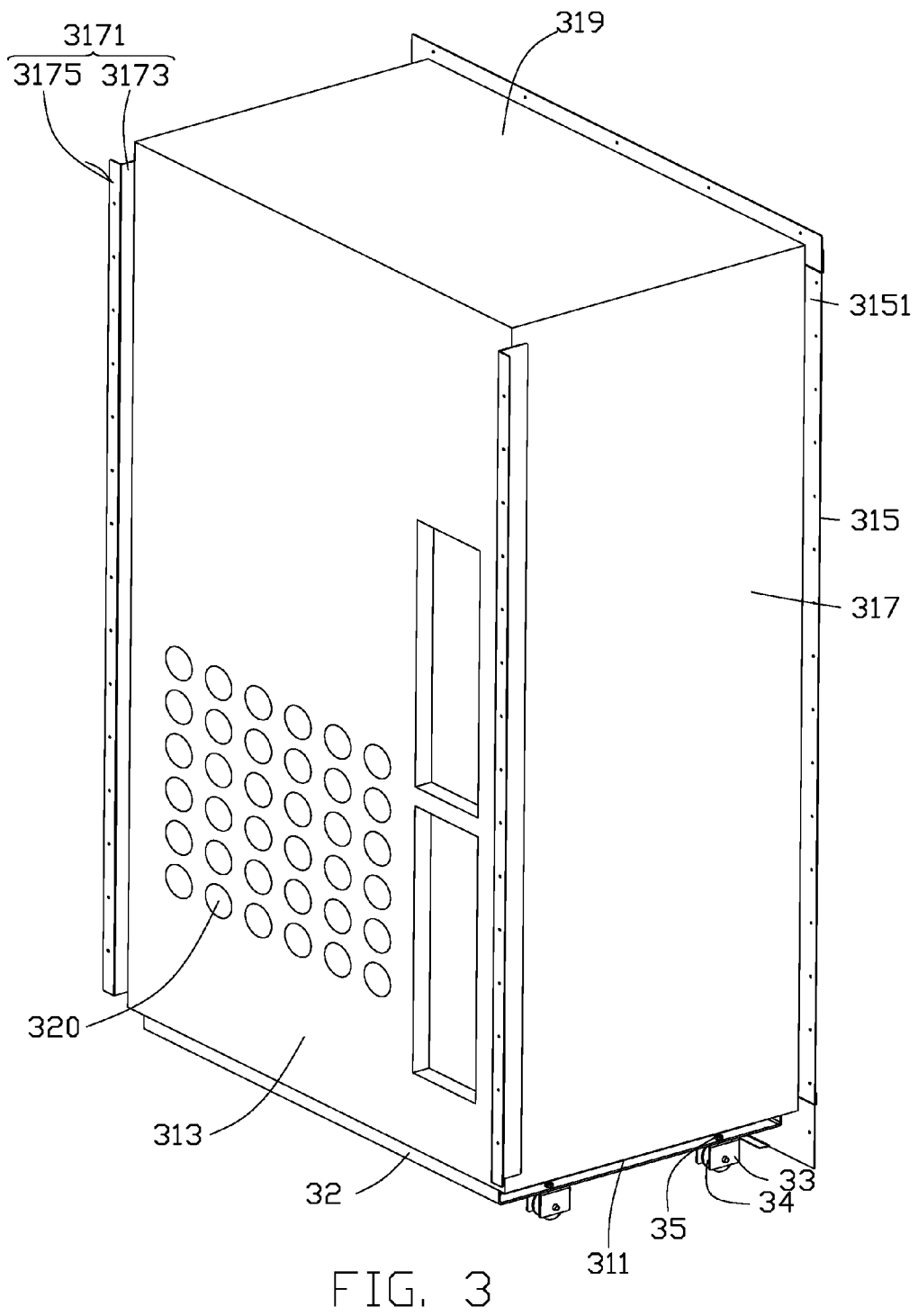
FIG. 3 is an isometric view of one of the cooling devices of FIG. 1 viewed from another angle.

FIG. 3 illustrates the cooling device 300. The cooling device 300 comprises a bottom wall 311, a front wall 313, a rear wall 315, two side walls 317, and a top wall 319. The front wall 313 and the rear wall 315 each define a plurality of vents 320. An L-shaped operating member 3171 is attached to each of the two side walls 317. Each operating member 3171 comprises a first plate 3173 coupled to the side wall 317 and a second plate 3175 perpendicularly extending from one side of the fixing plate 3173 in a direction away from the side wall 317. A blocking board 3151 is attached to the rear wall 315.

A hollow frame 32 is mounted on the bottom wall 311. A pair of U-shaped brackets 33 is mounted on each end of a bottom surface of the frame 32. The U-shaped brackets 33 is positioned under the bottom wall 311. A wheel 34 is rotatably mounted on each bracket 33. A threaded screw 35 vertically extends through the bracket 33. A lower portion of the screw 35 abuts the wheel 34. An upper portion of the screw 35 extends into the hollow frame 32 for convenient operation.

Figure 4:
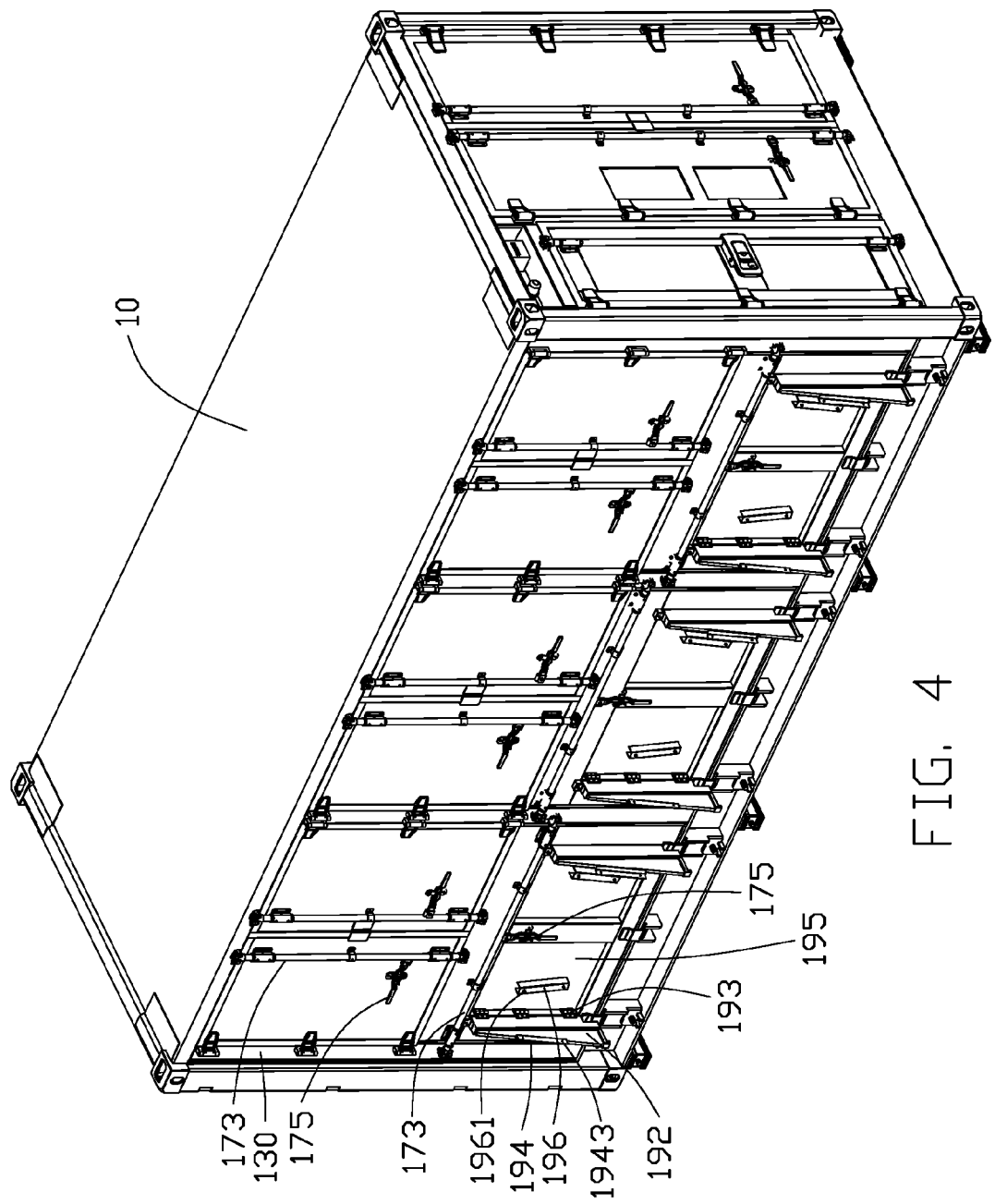
FIG. 4 is an assembled isometric view of the container data center of FIG. 1 showing the container data center in a first state.

FIG. 4 illustrates the assembled container data center in a first state. To move or transport the container data center, the top member 110 is removed, and the positions of the electronic devices 200 can be changed within a first portion of the defined interior space 103. The cooling devices 300 pass through the slots 101 to be loaded into and installed in the cabinet 100, specifically installed in a second portion of the defined interior space 103. The screws 35 are screwed to abut the wheels 34, and the cooling devices 300 are located at the first rail 121. Then the top member 110 is attached to the cabinet 100, the doors 170 are rotated to abut the stopper plate 133, and the support members 190 are rotated to abut the stopper plate 133. The openings 131 are covered by the doors 170 and the support members 190. The handles 175 of the doors 170 and the support member 190 are rotated to fasten the latching member 173 onto the plates 130, and the doors 170 and the support member 190 are fixed to the cabinet 100. The blocks 192 are rotated to be received in the corresponding recessed portions 195, and a plurality of screws 197 extends through the through holes 1943 to be fixed in the screw holes 1961. The support blocks 192 are fixed in the recessed portions 195.

Figure 5:
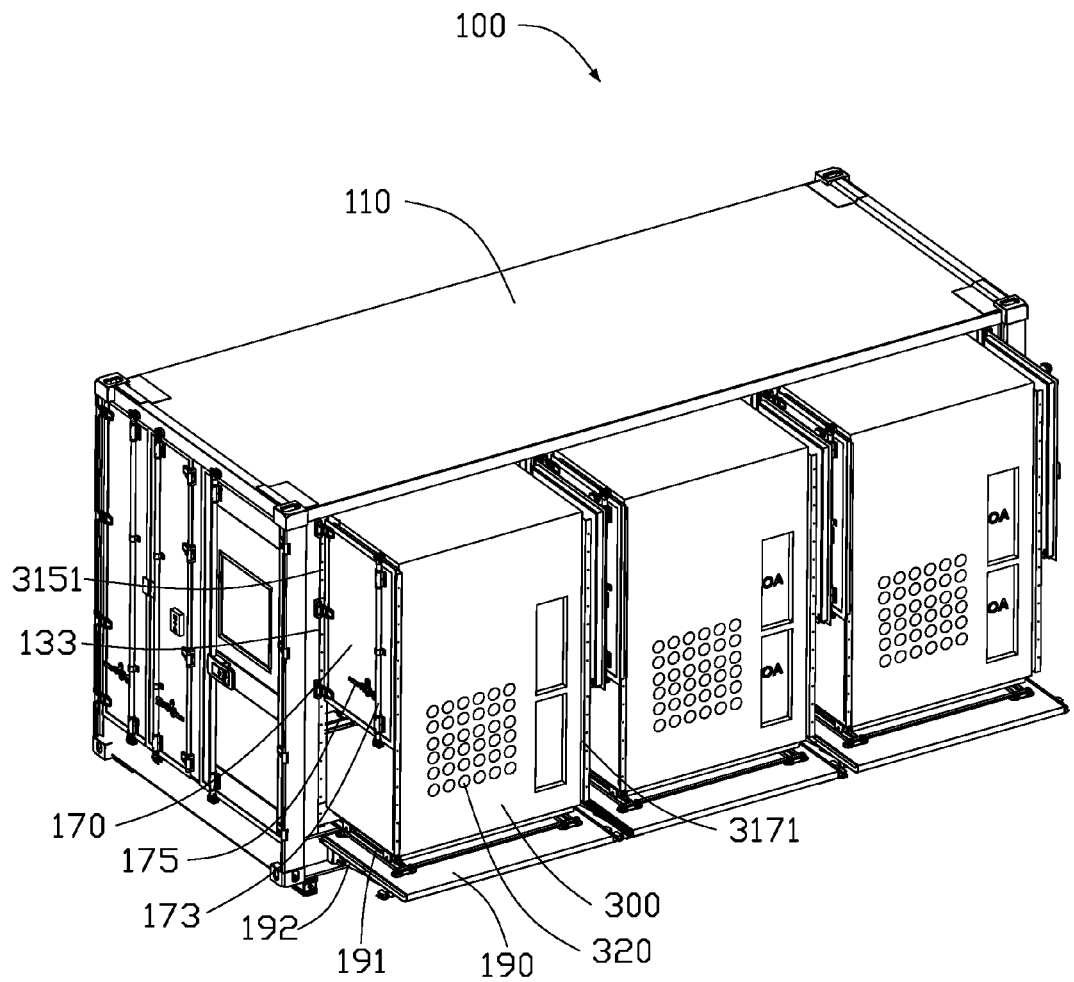
FIG. 5 is similar to FIG. 4 showing the container data center in a second state.

FIG. 5 illustrates the assembled container data center in a second state. When the container data center is in use, the handles 175 of the doors 170 and the support members 190 are rotated to release the latching members 173 from the plates 130. The screws 197 are unscrewed and the blocks 192 are rotated to be perpendicular to the support member 190. The doors 170 can be rotated to expose the openings 131. The support members 190 are rotated to lower the blocks 192 to the ground. The inside surface of the support members 190 is coplanar with the inside surface of the bottom member 120. The second rails 191 and the corresponding first rail 121 are positioned on a same plane. The screws 35 are rotated away from the wheels 34, and the cooling devices 300 are pulled outward by pulling the operating portions 3175. As shown in FIG. 1, the cooling devices 300 can slide from the first rails 121 to fit onto the second rails 191. As shown in FIG. 3, the screws 35 can be screwed to abut the wheels 34, and the cooling devices 300 are located at the second rails 191. The cooling devices 300 dissipate heat from the electronic devices 200. As shown in FIG. 5, the blocking board 3151 of the cooling devices 200 can be stopped by the stopper plates 133 of the cabinet 100 to prevent the cooling devices 300 from sliding out of the cabinet 100.

In other exemplary embodiments of the container data center, the first rails and the second rails can be replaced with slidable grooves.

When the cooling devices are located on the first rail, the container data center is compact and can be transported. When the support members are rotated down to the floor, the cooling devices can slide into the second rail from the first rail, and the cooling devices can be in a position to dissipate heat for the electronic devices. The container data center can be made ready for transport rapidly and rapidly set up for cooling.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims.

What is claimed is:

1. A container data center comprising:
   a cabinet having:
      a bottom member;
      a top member, the top member oppositely facing and substantially parallel to the bottom member; and
      a plurality of plates, each plate substantially perpendicular to the top member and the bottom member;
   at least one door rotatably attached to one of the plates;
   at least one support member rotatably attached to the one of the plates; and
   a plurality of electronic devices;
   a pair of blocks rotatably attached to an outside surface of each support member to perpendicularly contact a floor and providing support for the data container;
   wherein the bottom member, the top member, and the plurality of plates define an interior space;
   wherein the at least one electronic devices can be positioned in a portion of the defined interior space;
   wherein the at least one door and the at least one support member rotate away from the one of the plates to expose an opening defining in the one of the plates;
   the exposed opening allowing at least a part of one of the electronic devices to be inserted through the exposed opening and into another portion of the defined interior space; and
   wherein the at least one rotated support member is substantially parallel to and aligned with the bottom member when the door rotated away from the one of the plates to expose the opening, the at least one of the plurality of electronic devices is insertable into the defined interior space.

2. The container data center of claim 1, wherein an outside surface of each support member defines a recessed portion in the support member, each support member comprises two first fixing members and two second fixing members, wherein the recessed portion is located between two blocks, the two first fixing members are attached to a top edge of the two blocks, and the two second fixing members are formed in the recessed portion.

3. The container data center of claim 2, wherein each first fixing member comprises a first tab attached to one of the block and a second tab perpendicularly extending from the first tab; wherein the second tab defines two through holes therein; wherein each second fixing member defines two screw holes; wherein when the two blocks are received in the recessed portion, a plurality of screws extends through the through holes, fixes in the screw holes, and fixes the two first fixing members to the two second fixing members.

4. The container data center of claim 1, wherein the bottom member comprising a pair of first rails corresponding to each opening, each support member comprises a pair of second rails formed at an inside surface thereof, the pair of the second rails are aligned with the corresponding first rails, and the electronic devices are configured to slide on the first rails and the second rails.

5. The container data center of claim 4, wherein each cooling device comprises a bottom wall and a rear wall, the rear wall is perpendicular to the bottom wall; wherein a blocking board is attached to the rear wall, a stopper plate extends into the opening from each of the two side edges of each plate to stop the blocking board.

6. The container data center of claim 5, wherein a hollow frame is mounted on the bottom wall of each cooling device, a pair of brackets is mounted to a bottom of the bottom wall, and a wheel is rotatably mounted in each bracket to slide on the first rails and the second rails.

7. A container data center comprising:
a cabinet having:
  a bottom member;
  a top member, the top member oppositely facing and substantially parallel to the bottom member; and
  a plurality of plates, each plate substantially perpendicular to the top member and the bottom member; wherein the bottom member, the top member, and the plurality of plates defines an interior space;
  a door rotatably connected to one of the plates; and
  a support member rotatably connected to one of the plurality of plates;
wherein an electronic device is positioned in a portion of the defined interior space;
wherein the door and the support member rotate away from the one of the plates to form an opening along a lengthwise direction of the one of the plates;
wherein at least a part of one or more of the electronic device is insertable through the opening into a second portion of the defined interior space; and
wherein when rotated away to form the opening, the support member rotated is substantially parallel to the bottom member, and one portion of the electronic device is insertable into the defined interior space, the bottom member comprising a pair of first rails corresponding to each opening, each support member comprises a pair of second rails formed at an inside surface thereof, the pair of the second rails are aligned with the corresponding first rails, and the cooling devices are configured to slide on the first rails and the second rails, each cooling device comprises a bottom wall and a rear wall, the rear wall is perpendicular to the bottom wall; wherein a blocking board is attached to the rear wall, and a stopper plate extends into the opening from each of the two side edges of each plate to stop the blocking board.

8. The container data center of claim 7, wherein a pair of blocks are rotatably attached to an outside surface of each support member to perpendicularly contact a floor and provide support for the data container.

9. The container data center of claim 8, wherein an outside surface of each support member defines a recessed portion in the support member, each support member comprises two first fixing members and two second fixing members, wherein the recessed portion is located between two blocks, the two first fixing members are attached to a top edge of the two blocks, and the two second fixing members are formed in the recessed portion.

10. The container data center of claim 9, wherein each first fixing member comprises a first tab attached to the block and a second tab perpendicularly extending from the first tab; wherein the second tab defines two through holes therein; wherein each second fixing member defines two screw holes; and wherein when the two blocks are received in the recessed portion, a plurality of screws extends through the through holes, fixes in the screw holes, and fixes the two first fixing members to the two second fixing members.

11. The container data center of claim 7, wherein a hollow frame is mounted on the bottom wall of each cooling device, a pair of brackets is mounted to a bottom of the bottom wall, and a wheel is rotatably mounted in each bracket to slide on the first rails and the second rails.

* * * * *

UNITED STATES PATENT AND TRADEMARK OFFICE
CERTIFICATE OF CORRECTION

PATENT NO. : 9,924,612 B2  
APPLICATION NO. : 15/293629  
DATED : March 20, 2018  
INVENTOR(S) : Hung-Chou Chan et al.

Page 1 of 1

It is certified that error appears in the above-identified patent and that said Letters Patent is hereby corrected as shown below:

On the Title Page

Please replace item (30) regarding "Foreign Application Priority Data" with the following:  
(30) Foreign Application Priority Data  
Nov 28, 2014 (CN) ...............................201410701645.8

Signed and Sealed this  
Twenty-third Day of October, 2018

Andrei Iancu  
*Director of the United States Patent and Trademark Office*